United States Patent [19]

Cremer et al.

[11] Patent Number: 5,203,980
[45] Date of Patent: Apr. 20, 1993

[54] LARGE SURFACE CATHODE ARRANGEMENT OF UNIFORM CONSUMPTION

[75] Inventors: Dieter Cremer, Overath; Hans-Gerhard Dederichs, Cologne, both of Fed. Rep. of Germany

[73] Assignee: Multi-Arc Oberflächentechnik GmbH, Bergisch-Gladbach, Fed. Rep. of Germany

[21] Appl. No.: 782,151

[22] Filed: Oct. 25, 1991

[30] Foreign Application Priority Data

Oct. 26, 1990 [DE] Fed. Rep. of Germany ... 9014857[U]

[51] Int. Cl.$^5$ .............................................. C23C 14/34
[52] U.S. Cl. ........................... 204/298.08; 204/298.09; 204/298.12
[58] Field of Search ...................... 204/298.08, 298.09, 204/298.12

[56] References Cited

U.S. PATENT DOCUMENTS

3,945,911 3/1976 McKelvey ...................... 204/298.25

Primary Examiner—Aaron Weisstuch
Attorney, Agent, or Firm—Robert W. Becker & Associates

[57] ABSTRACT

A large surface cathode arrangement with a consumable cathode plate that is connected via an intermediate plate with high electrical and thermal conductivity to a base plate is provided. The arrangement is provided with cooling channels. Current supply conduits and current supply locations for uniformly distributing the electrical current density and the electrical potential within the cathode plate are furthermore provided which allow the consumption of the cathode plate to become more uniform. Preferably, three or more current supply conduits are connected to a plurality of current supply locations that are uniformly distributed over the base plate. The cooling channels are provided at the face of the intermediate plate which is facing the base plate so that a continuous wall of the intermediate plate is in contact with the cathode plate, thus contributing to the improvement of the current distribution. The cathode arrangement is especially suitable for coating apparatus according to the PVD principle.

21 Claims, 2 Drawing Sheets

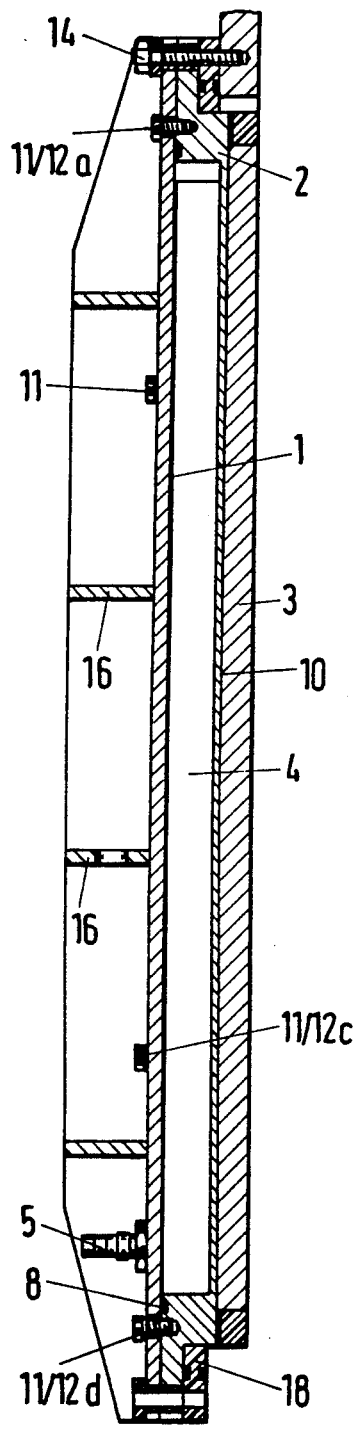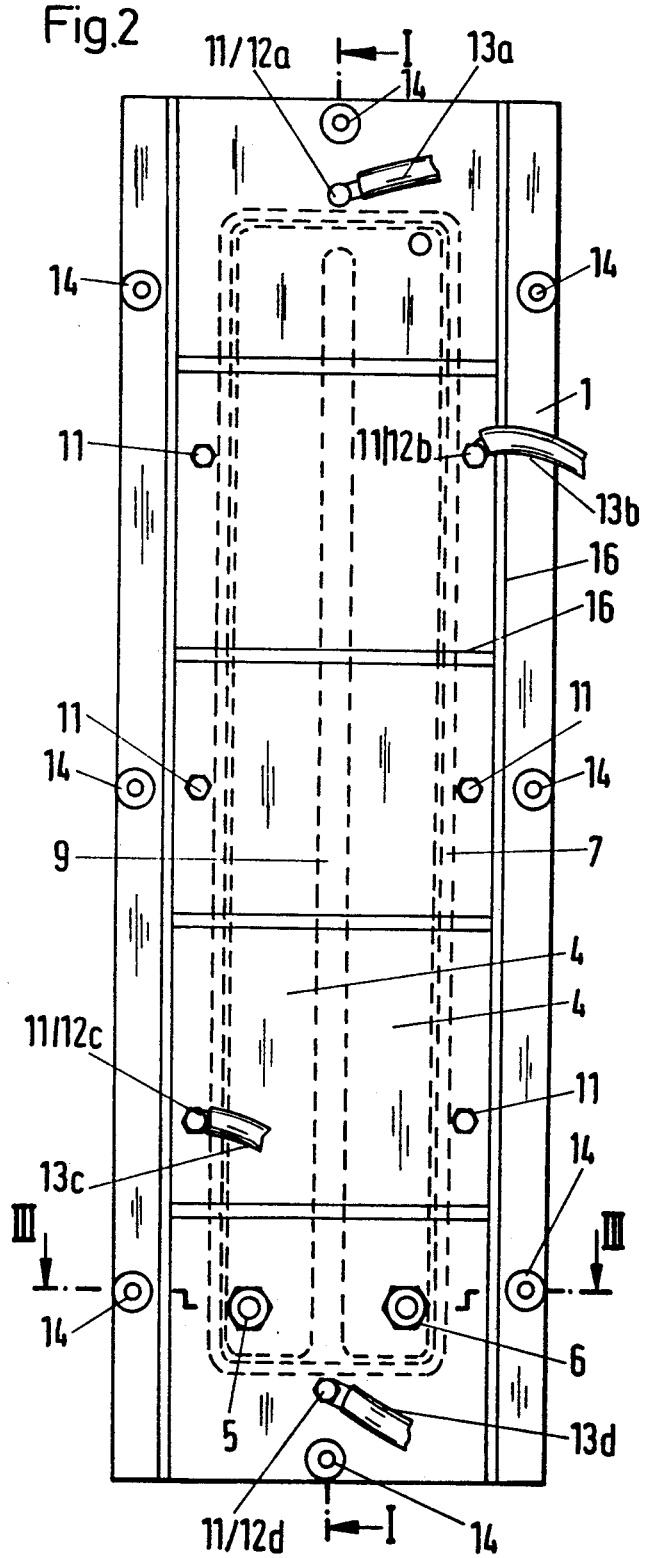

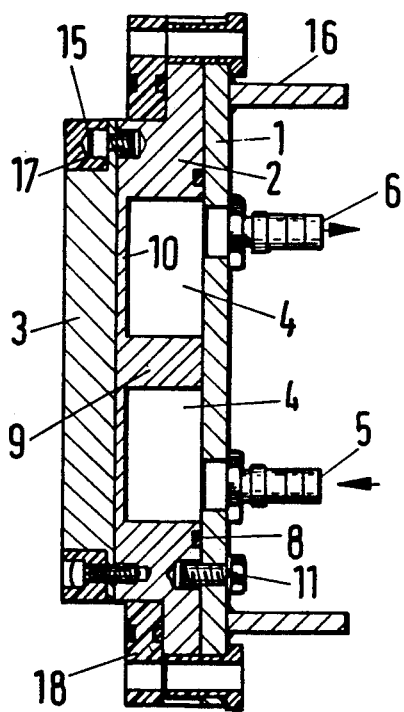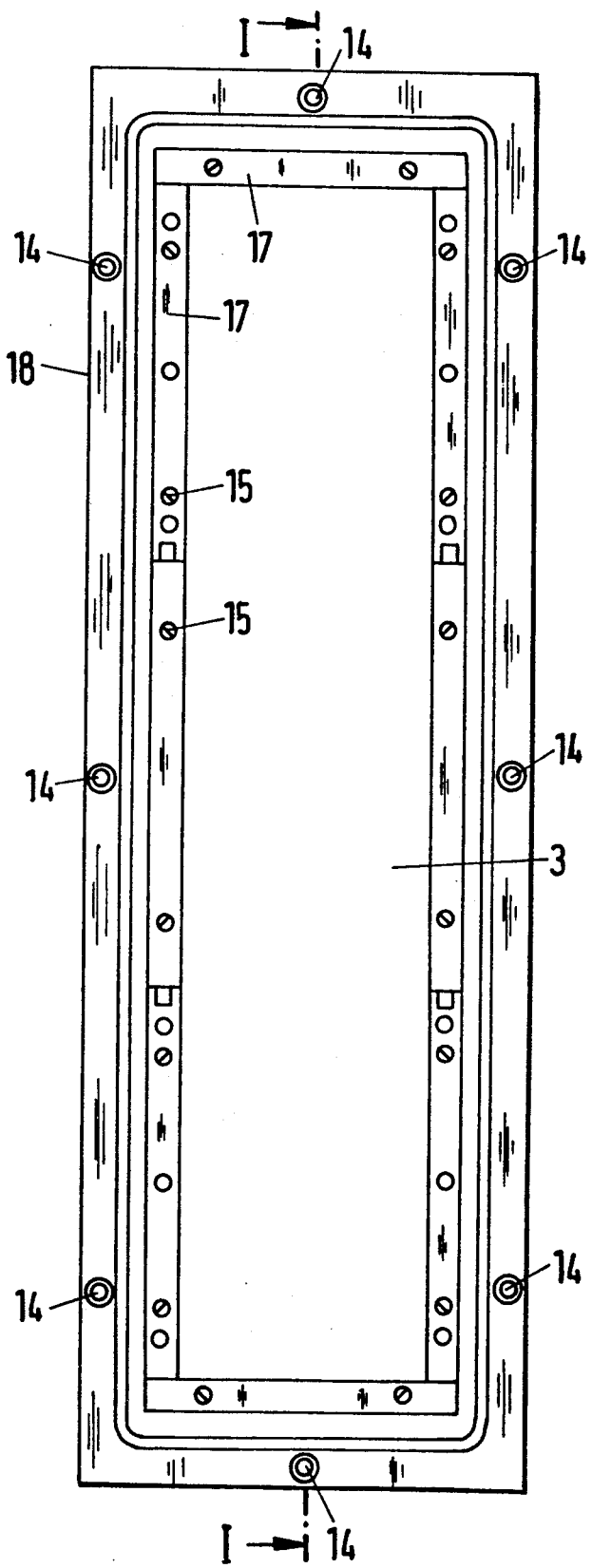

LARGE SURFACE CATHODE ARRANGEMENT OF UNIFORM CONSUMPTION

BACKGROUND OF THE INVENTION

The present invention relates to a cathode arrangement with a large surface area comprising a consumable cathode plate that is connected to an intermediate plate with a high electrical and thermal conductivity and/or to a base plate whereby the arrangement is provided with cooling channels.

Such cathode arrangements are, for example, employed in coating apparatus and serve as a source for at least a portion of the material that provides the coating. Especially, cathode plates consisting of, for example, titanium, chromium, titanium-aluminum, titanium-zirconium, are employed for the coating of workpieces. When such coating apparatus are in operation the cathode plates are provided with large electrical currents in order to generate an electrical arc which, depending on the coating procedure, may be further biased by magnetic fields.

With the known coating processes and coating apparatus it has been a problem up to now to achieve a uniform consumption of the cathode plate. In general, the cathode plates are consumed in a non-uniform manner so that their service life is shorter than theoretically possible. Experiments in which the consumption behavior of the cathode plate has been subjected to various measures, for example, static magnetic fields, have resulted in improvements; however, the cathode plates are still consumed at a higher rate in individual areas.

It is therefore an object of the present invention to provide a large surface cathode arrangement with which a uniform consumption of the cathode plate is possible.

BRIEF DESCRIPTION OF THE DRAWINGS

This object, and other objects and advantages of the present invention, will appear more clearly from the following specification in conjunction with the accompanying drawings, in which:

FIG. 1 shows a longitudinal cross-sectional view of the inventive cathode arrangement along the lines I—I in FIGS. 2 and 4;

FIG. 2 is a front view of the exterior of the cathode arrangement;

FIG. 3 is a cross-sectional view along the line III—III of FIG. 2; and

FIG. 4 is a view of the interior of the cathode arrangement, showing the cathode plate.

SUMMARY OF THE INVENTION

The cathode arrangement of the present invention is primarily characterized by a base plate, a consumable cathode plate an intermediate plate with high electrical and thermal conductivity, arranged between the base plate and the cathode plate, cooling channels arranged in a space between the base plate and the cathode plate, and means for uniformly distributing electrical current densities and electrical potentials within the cathode plate. The cathode plate may be connected to the intermediate plate or to the base plate. It is also possible that the cathode plate is connected to the intermediate plate and the base plate. The invention is based on the concept that presumably the non-uniform consumption of the cathode plate is caused by a non-uniform distribution of the electrical current densities within the cathode plate. Although the cathode plate itself and also the parts that support the cathode plate are relatively massive metal parts, and in general an intermediate plate, for example, made of copper or a copper alloy or aluminum, is used, which is especially well suited to conduct electric currents, in known arrangements a non-uniform electrical current distribution occurred, seemingly, since the required electrical current was supplied in general only into the center section of the cathode arrangement. However, when means for uniformly distributing electrical currents are provided then the consumption of the cathode plate is more uniform and the quality of the coating is improved.

One of the simplest possibilities for distributing electrical densities in a more uniform manner is the application of a plurality of current supply conduits that are connected to the base plate and/or the intermediate plate at different spaced-apart places of the cathode arrangement. Depending on the size of the cathode arrangement three or more current supply conduits are desirable.

It is especially advantageous when the current supply conduits are connected to a plurality of current supply locations that are uniformly distributed over the surface area of the base plate and/or the intermediate plate.

Known cathode arrangements are comprised of a base plate and an intermediate plate, whereby the intermediate plate is comprised of copper, a copper alloy or another conductive metal, and wherein cooling channels that are U-shaped or meander-shaped are provided at the intermediate plate. In order to achieve the inventive results it is especially advantageous when the intermediate plate is provided with a continuous smooth wall at the face that is facing the cathode plate, preferably, the thickness of the wall is 2 to 8 mm. The cooling channels are then arranged on the face of the intermediate plate which is facing the base plate. The cooling channels are delimited by the base plate. The continuous wall which is facing the cathode plate contributes substantially to the more uniform distribution of the electrical current and furthermore prevents that the cooling medium may enter the coating apparatus when the cathode plate is completely consumed at one location so that leaks result. Both results may not be achieved by conventional cooling channels which are arranged at the intermediate plate facing the cathode. Due to the excellent heat conductivity of the intermediate plate, however, it is necessary that the cooling channels are slightly displaced towards the outer side of the coating apparatus. This displacement does not result in any disadvantages.

When selecting the positions of the current supply locations the arrangement of the cooling channels within the intermediate plate should be taken into account. These cooling channels impede a uniform current distribution so that the current supply locations should be arranged exactly where the intermediate plate is provided with massive cross-pieces in order to favor a uniform distribution of the electrical current.

It is practical knowledge that the consumption of the cathode plate is less in the outer areas than in the central areas and accordingly at least a portion of the current supply locations should be arranged within the outer area of the intermediate plate which is free of cooling channels.

With conventional rectangular cathode plates which have two long and two short sides, at least one of the current supply locations should be arranged within an area of each of the short sides of the cathode plate.

DESCRIPTION OF PREFERRED EMBODIMENTS

The present invention will now be described in detail with the aid of several specific embodiments utilizing FIGS. 1 through 4.

The cathode arrangement is of a layer design and comprises a base plate 1, an intermediate plate 2 with high electrical and thermal conductivity, preferably made of copper or a copper alloy, and the actual cathode plate 3 which is comprised of the material to be sputtered, for example, titanium. The cathode plate 3 is conventionally mounted via a holder 17 (not described in detail) and cathode holding screws 15 such that it is in flush contact with the intermediate plate 2. The intermediate plate 2 is provided with a continuous wall 10 that contacts the cathode plate 3 and is provided with cooling channels 4 at a face which is facing the base plate 1. In the present case, the cooling channels 4 are U-shaped and are separated from one another in a longitudinal direction by a center cross-piece 9. The intermediate plate 2 is further provided with a sealing groove 7 into which a seal 8 is inserted that provides a tight connection between the base plate 1 and the intermediate plate 2. A cooling medium inlet 5 and a cooling medium outlet 6 are provided at the base plate 1. The base plate 1 and the intermediate plate 2 are connected to one another by holding screws 11. The complete cathode arrangement may be connected to the wall of a coating apparatus in a sealing manner via a frame 18, which is not described in detail in the present invention, and with fastening screws 14, so that the cathode arrangement is located in the interior of the coating apparatus. Reinforcement ribs 16 provide the necessary structural stability to the entire arrangement.

The supply of the electrical current to the cathode arrangement is achieved by electrical current supply conduits 13a, b, c, d whereby in the present embodiment these current supply conduits are connected to a portion of the holding screws 11 thereby reducing the mounting expenditures. This is, however, not a prerequisite and individual fastening means may be chosen. It is important that the current supply locations 12a, b, c, d which in the present case coincide with the holding screws 11 are distributed uniformly over the surface area of the cathode arrangement. The current distribution with respect to the position of the cooling channels 4 should be additionally considered even though the continuous wall 10 of the intermediate plate 2 may compensate small irregularities of the current supply. In the present embodiment the current supply locations 12a, d are disposed in the area of the short sides of the cathode arrangement whereby the current supply locations 12b, c are especially favorably arranged with respect to the introduction of current into the center cross-piece 9. The current supply locations 12a, b, c, d are provided outside of the sealing groove 7 (represented in a dash-dotted line in FIG. 2) and are thus within the massive area of the intermediate plate.

The present invention is especially suitable for cathodes of physical vapor deposition apparatus (PVD), however, it is not limited to this special type of application.

The present invention is, of course, in no way restricted to the specific disclosure of the specification and drawings, but also encompasses any modifications within the scope of the appended claims.

What we claim is:

1. A cathode arrangement with a large surface area, comprising:
    a base plate;
    a consumable cathode plate;
    an intermediate plate with high electrical and thermal conductivity, arranged between said base plate and said cathode plate;
    cooling channels arranged in a space between said base plate and said cathode plate; and
    means for uniformly distributing electrical current densities and electrical potentials within said cathode plate.

2. A cathode arrangement according to claim 1, wherein said cathode plate is connected to said intermediate plate.

3. A cathode arrangement according to claim 1, wherein said electrical distributing means comprises a plurality of current supply conduits.

4. A cathode arrangement according to claim 3, wherein at least three current supply conduits are provided.

5. A cathode arrangement according to claim 3, wherein said current supply conduits are connected to said base plate.

6. A cathode arrangement according to claim 3, wherein said current supply conduits are connected to said intermediate plate.

7. A cathode arrangement according to claim 3, wherein said current supply conduits are connected to said base plate and said intermediate plate.

8. A cathode arrangement according to claim 3, wherein said electrical distributing means further comprises a plurality of current supply locations, to which said current supply conduits are connected.

9. A cathode arrangement according to claim 8, wherein said current supply locations are uniformly distributed over the surface area of said base plate.

10. A cathode arrangement according to claim 8, wherein said current supply locations are uniformly distributed over the surface area of said intermediate plate.

11. A cathode arrangement according to claim 8, wherein said current supply locations are uniformly distributed over the surface area of said base plate and the surface area of said intermediate plate.

12. A cathode arrangement according to claim 8, wherein said intermediate plate is comprised of a copper-containing material and said cooling channels are arranged at said intermediate plate such that a first face of said intermediate plate that is facing said cathode plate has a continuous smooth wall and a second face of said intermediate face that is facing said base plate is provided with said cooling channels, with said cooling channels being delimited by said base plate.

13. A cathode arrangement according to claim 12, wherein said copper-containing material is copper.

14. A cathode arrangement according to claim 12, wherein said copper-containing material is a copper alloy.

15. A cathode arrangement according to claim 12, wherein said cooling channels are U-shaped.

16. A cathode arrangement according to claim 12, wherein said cooling channels are meander-shaped.

17. A cathode arrangement according to claim 12, wherein said wall has a thickness of 2 to 8 mm.

18. A cathode arrangement according to claim 8, wherein said current supply locations are selected with respect to the arrangement of said cooling channels such that said intermediate plate is uniformly supplied with electrical current.

19. A cathode arrangement according to claim 8, wherein at least a portion of said current supply locations are arranged within an outer area of said intermediate plate that is free of said cooling channels.

20. A cathode arrangement according to claim 8, wherein said cathode plate is essentially rectangular and has at least one of said current supply locations within an area of each short side of said cathode plate.

21. A cathode arrangement according to claim 8, wherein said intermediate plate is provided with cross-pieces and at least a portion of said current supply locations are provided at said cross-pieces.

* * * * *